(12) United States Patent  
Khuc et al.

(10) Patent No.: US 9,317,477 B1  
(45) Date of Patent: Apr. 19, 2016

(54) METHOD FOR TRANSFERRING 16-BIT DATA THROUGH 8-BIT DEVICES

(75) Inventors: Lloyd D. Khuc, Wharton, NJ (US); Barry Schwartz, Newton, NJ (US); Jason Cahayla, West Milford, NJ (US); Triet La, Piscataway, NJ (US); Robert P. Bryan, Newark, NJ (US); John Geaney, Lafayette, NJ (US); Olivier Nguyen, Somerville, NJ (US)

(73) Assignee: The United States of America as Represented by the Secretary of the Army, Washington, DC (US)

( * ) Notice: Subject to any disclaimer, the term of this patent is extended or adjusted under 35 U.S.C. 154(b) by 714 days.

(21) Appl. No.: 13/445,248

(22) Filed: Apr. 12, 2012

(51) Int. Cl.  
*G06F 17/10* (2006.01)

(52) U.S. Cl.  
CPC ...................................... *G06F 17/10* (2013.01)

(58) Field of Classification Search  
None  
See application file for complete search history.

(56) References Cited

U.S. PATENT DOCUMENTS 5,752,225 A * 5/1998 Fielder .......................... 704/229  
7,660,414 B2 * 2/2010 Suzuki ............................ 380/44

* cited by examiner

*Primary Examiner* — Michael D Yaary  
(74) *Attorney, Agent, or Firm* — Henry S. Goldfine

(57) ABSTRACT

A computer program product corrects a detonation time from a ballistic table, based on the actual velocity of a projectile measured upon exit of the projectile from the gun tube. The computer program product transfers a 16-bit data stream, through a 16-bit to an 8-bit encoder, to a fuze controller implemented as an 8-bit platform, to provide precise timing adjustment to a fuze controller. The computer program product significantly improves the accuracy of detonation times for air burst mode. The encoder calculates the absolute truncated, square rooted, X, of the input time delay number, as well as the error correction number, Y. The encoder then transmits both numbers X and Y as an 8-bit data stream, optionally along with the parity data to the fuze controller.

1 Claim, 5 Drawing Sheets

METHOD FOR TRANSFERRING 16-BIT DATA THROUGH 8-BIT DEVICES

GOVERNMENTAL INTEREST

The invention described herein may be manufactured and used by, or for the Government of the United States for governmental purposes without the payment of any royalties thereon.

FIELD OF THE INVENTION

The present invention relates in general to the field of munitions. More specifically, this invention relates to a method and associated computer program product for encoding and transmitting a digital 16-bit data stream through 8-bit modules. The present invention may be used, for example in a new velocity correction circuitry in a fuze, to provide adjustment of detonation times issued from fire control.

BACKGROUND OF THE INVENTION

Serial communication is one of the functions often required in the development of integrated microsystems. In most applications, when data is exchanged, a serial interface unit sends and receives bit sequences on the status of these bits, to and from another unit that processes the bit sequence.

The serial input/output (SIO) unit is a serial interface used for communicating with other units. It is also important for low power consumption in portable applications.

The amount of serial data is fixed in the conventional SIO. Generally, the width of the data is fixed at 8 bits or 16 bits. An operator selects either the 8-bit or the 16-bit serial interface depending on the design. However, such manual selection between the 8-bit and the 16-bit may hamper the use of new technological advancements in connection with existing or "vintage" devices.

More specifically, ordnance systems such as artillery shells, rocket propelled munitions, mortar shells and the like, are becoming increasingly, technologically sophisticated, with communication and accuracy playing a fundamental role. The main problem with communications lies in transferring a 16-bit data stream by using a 16-bit platform in ordnance systems that are either incapable, or that do not adequately support the 16-bit platform. Conventional methods have been proposed to address this concern.

One such conventional method proposes updating the electronic circuitry to a platform that can handle the size of the data being transferred. In this case, it would be the expansion of an 8-bit processor to a 16-bit processor. However, the complexity of such expansion significantly increases the cost, space constraint, complexity, and power consumption of the system.

What is therefore needed is a method and associated computer program product for encoding and transmitting a 16-bit data through 8-bit modules without hardware conversion. Prior to the advent of the present invention, the need for such a method and associated computer program product has heretofore remained unsatisfied.

SUMMARY OF THE INVENTION

The present invention satisfies this need, and describes a new method and associated computer program product (collectively referred to herein as "the invention," "the present invention," "the computer program product," or "the product" for encoding and transmitting 16-bit data through 8-bit modules, without hardware modifications to the ordnance systems. The present invention may be used for example, in a new velocity correction circuitry of a fuze controller, to provide adjustment of detonation times issued from fire control.

For the current application as it pertains to fuzing, a specific number is to be transferred between two modules, such as for example, only, a velocity correction module and a fuze controller. In this example, the velocity correction module computes the actual exit velocity of the projectile and stores this figure in the form of a number that is to be transferred and loaded into the fuze controller.

The purpose of this uploaded data is to provide the fuze with a live exit velocity so the fuze can more accurately predict an airburst time delay. It is therefore critical that once a number is determined in the velocity correction module, there is no loss of precision, and that the data is transferred as fast as possible to minimize any error. Once the data is transferred from module to module, the fuze is able to update the time delay accordingly and detonate at the correct time.

In one embodiment, the velocity correction circuitry requires a 16-bit architecture to perform complex calculations based on sensor data. The present invention corrects the detonation time from a ballistic table, based on the actual velocity of a projectile measured upon exit of the projectile from the gun tube or muzzle. The present invention provides precise timing adjustment to the currently existing fuze built upon an 8-bit architecture. It significantly improves the accuracy of detonation times for air burst mode.

The present computer program product solves the problem of transferring the 16-bit data stream between modules, by reducing or encoding the 16-bit data stream into a two-part, 8-bit data stream. The computer program product may optionally expand or decode the two-part, 8-bit data stream back into the original 16-bit data stream without significant loss of precision or error into the computation. The present invention becomes of particular importance when transferring large data sizes on a reduced processor platform.

The present invention includes an encoder or encoding module that converts the inputted 16-bit data stream, T, into a two-part 8-bit data stream, X and Y. The encoder calculates the truncate square root, X, of the input number, e.g., time delay, T, and transmits the calculated square root as an 8-bit data stream. The encoder further calculates an error correction number, Y, and transmits it as an 8-bit data stream.

In a preferred embodiment, the error correction number, Y, is calculated by subtracting the square number X from the original number, T. The original time delay number, T, can now be viewed as a composite of two 8 bit numbers, X and Y. The two 8-bit numbers, X and Y, are then transferred to a fuze, and optionally (though not necessarily) expanded or decoded, to provide the actual time delay, T.

BRIEF DESCRIPTION OF THE DRAWINGS

The above and other features of the present invention and the manner of attaining them, will become apparent, and the invention itself will be best understood, by reference to the following description and the accompanying drawings, wherein.

Similar numerals refer to similar elements in the drawings. It should be understood that the sizes of the different components in the figures are not necessarily in exact proportion or to scale, and are shown for visual clarity and for the purpose of explanation.

DETAILED DESCRIPTION OF PREFERRED EMBODIMENTS

Figure 5:
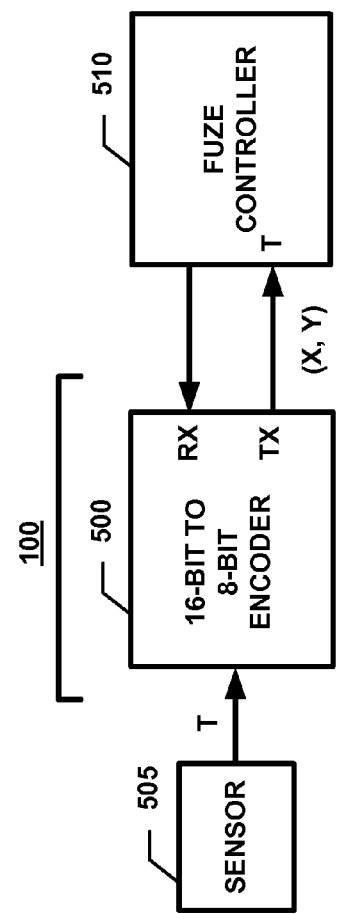
FIG. 5 is a high level block diagram of the components of the computer program product, according to a preferred embodiment of the present invention.

With reference to FIG. 5, it illustrates a preferred embodiment of a computer program product 100 according to a preferred embodiment of the present invention. In a preferred embodiment, the computer program product 100 is embedded within, or programmed onto a 16-bit to 8-bit encoder (or encoding module) 500 that receives an input 16-bit data stream containing a number, T, from a sensor (or sensors) 505, for transmission to an 8-bit platform, such as a fuze controller 510. The fuze controller 510 reconstructs the original 16-bit input data stream as an 8-bit representation of the 16-bit number, T, with minimal errors.

Figure 1:
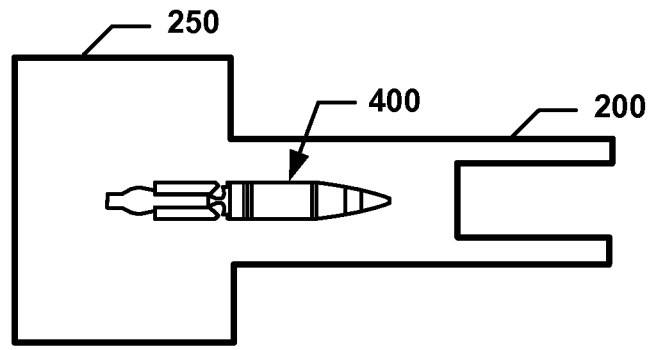
FIG. 1 is a schematic illustration of an ordnance system incorporating the computer program product of the present invention, and showing a projectile housed with a gun, prior to firing.
Figure 2:
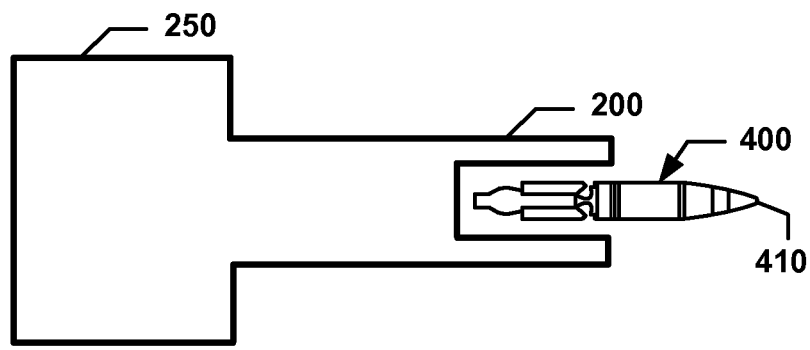
FIG. 2 is a schematic illustration of the ordnance system of FIG. 1, showing the projectile exiting a barrel of the gun, after firing.
Figure 4:
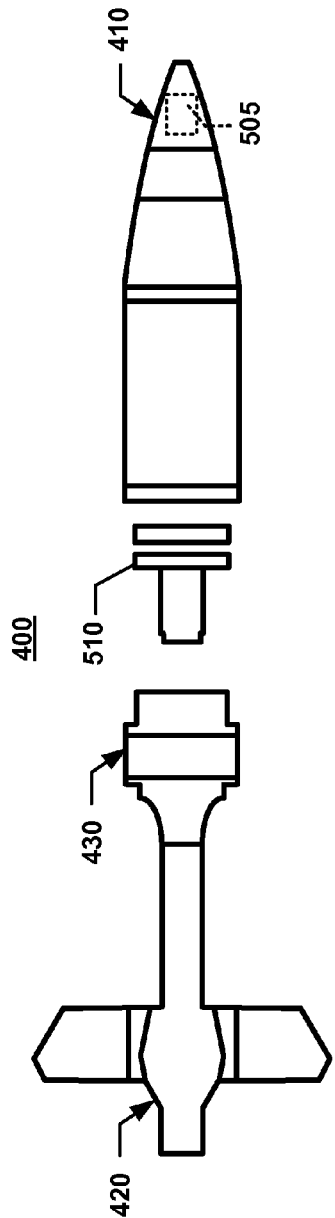
FIG. 4 is an exploded view of the projectile of FIGS. 1, 2, and 3, illustrating the location of the present computer program product within the projectile.

FIG. 4 shows an exemplary projectile 400 as including a forward section 410, an aft section 420, and a body 430. For illustration purpose only, the sensor 505 is preferably located at, or within the forward section 410. Such disposition of the sensor 505 will ensure an expedient and accurate reading of the sensed parameter, as soon as the projectile 400 exits a barrel 200 of a gun (or ordnance) system 250 (FIGS. 1 and 2). The fuze and the computer program product 100 are disposed within the body 430.

Figure 3:
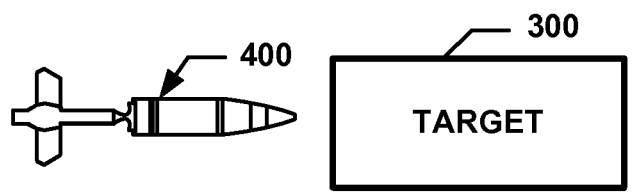
FIG. 3 is a schematic illustration of the projectile shown approaching a designated target.

As an initial stage, which is illustrated in FIG. 1, the fuze controller 510 is fed (or programmed) with an approximate timing value, $T_e$, that is based on an estimated exit velocity of the projectile 400 from the gun barrel 200, the proximity of the gun system 250 from the intended target 300 (FIG. 3), and other parameters that affect the flight path of the projectile 200.

The fuze controller 510 will be initiated (i.e., detonate) at the expiration of the approximate timing value, $T_e$. However, as soon as the projectile 400 exits the gun barrel 200, the sensor 505 measures, for example, the actual exit velocity of the projectile forward section 410.

In turn, the encoder 500 (or another processor) calculates a new accurate timing value, T, and transmits this accurate value, T, to the fuze controller 510. For simplicity of illustration, it will be assumed that a 16-bit accurate timing value, T, is being transmitted.

In the context of the present invention, it is assumed that the fuze controller 510 is an 8-bit unit that is incapable of directly processing the 16-bit accurate timing value, T. To this end, the encoder 500 divides the 16-bit accurate timing value, T, into a two-part 8-bit data stream, X and Y, as it will be described later in greater detail by the examples to follow.

The encoder 500 transmits the 8-bit data stream (X, Y) to the fuze controller 510. The fuze controller 510 uses the 8-bit values (X, Y) to reconstruct the accurate timing value, T, as an 8-bit data stream, and to use this accurate timing value, T, for detonation, thus achieving a very highly accurate adjustment of the detonation time.

For the current application as it pertains to fuzing, a specific number, T, is to be transferred between two generally incompatible modules: the 16-bit sensor 505 and the 8-bit fuze controller 510. If the fuze controller 510 is capable of processing 16-bit data streams, then the encoder 500 will be bypassed. If the fuze controller 510 is capable of processing only 8-bit data streams, then the 16-bit to 8-bit encoder 500 is needed to convert the accurate timing value, T, to two 8-bit values: (X, Y). The computer program product 100 will reconstruct the original accurate timing value, T, by calculating T, as follows: $T=X^2+Y$.

It should be clearly understood that while specific examples are provided, there is no intention to limit the present invention to the specific embodiments (or examples) described herein.

In this specific example, the number, T, to be transmitted, represents an accurate fuzing time that has been provided by (or processed from a reading secured by) the sensor 505. In this example, the sensor 505 is a velocity correction module (also referenced herein as 505).

The velocity correction module (or sensor) 505 computes the actual exit velocity of the projectile 400, and stores this figure in the form of a number, T, that is to be transferred and loaded into the fuze controller 510. The purpose of this input number, T, is to provide the fuze controller 510 capability to accurately predict an airburst time delay using a live exit velocity.

It is therefore critical that once the number, T, is determined in the velocity correction module 505, there is no loss of precision, and that the data is transferred as fast as possible (e.g., within a few milliseconds to approximately 25 milliseconds) to minimize any error. Once the data, T, is transferred to the fuze controller 510, the fuze controller 510 will update the time delay accordingly, to cause detonation at the accurate time.

Figure 6:
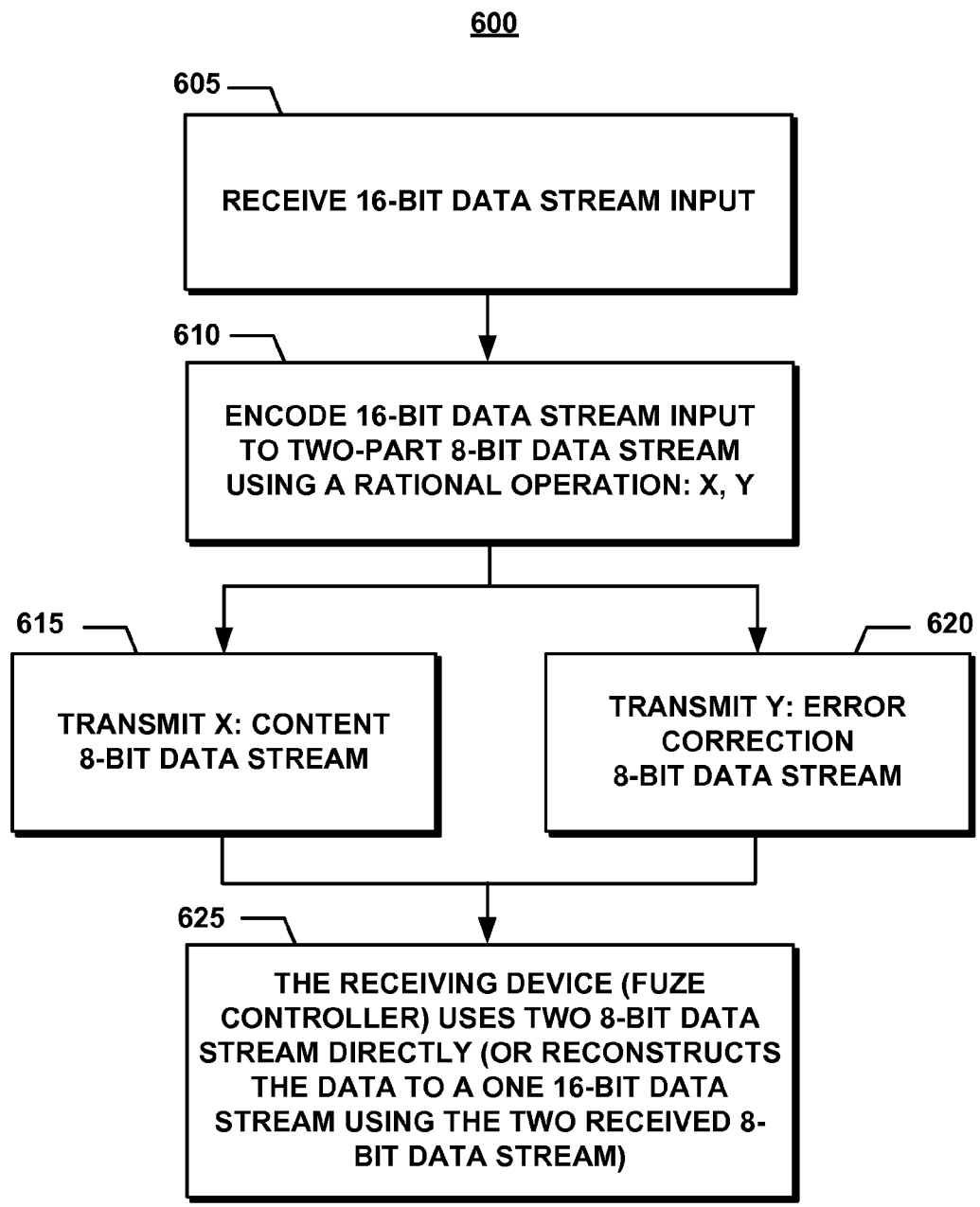
FIG. 6 is a flow chart illustrating the operation of the computer program product of FIG. 5.

FIG. 6 is a flow chart that illustrates a process of operation 600 of the computer program product 100 of FIG. 5. More specifically, the velocity correction module 505 can, for example, compute numbers up to 65,536 (16 bits). However, to transfer these figures to the fuze controller 510, would require a larger processor than the existing 8-bit processor of the fuze controller 510.

In this example, and in order to eliminate the need for the larger processor, the velocity correction module 505 senses or computes the 16-bit time delay number, T, and transfers it to the computer program product 100. As shown at step 605 of the process 600, the encoder module 500 receives the 16-bit time delay number, T, from the sensor module 505.

In turn, the encoder module 500 divides, at step 610, the time delay number, T, into a two-part 8-bit data stream that includes an integer (whole number), X, and an error value, Y. At steps 615, 620, the encoder module 500 transmits the two values X and Y to the fuze controller 510. Depending on the application and the devices used therein, at step 625, the fuze controller 510 can either use the two 8-bit data (X, Y) decodes the two received numbers, X, Y; or it can alternatively reconstruct the original time delay number T as a single 16-bit data stream using the received numbers X, Y.

The encoder module 500 calculates the two 8-bit numbers X and Y by first calculating the square root of the 16-bit time delay number, T, and then by truncating the square rooted number to an integer, as illustrated in the following equations 1 and 2:

$$\text{Time Delay } (T) = X^2 + Y \quad (1)$$

$$X = T^{1/2} \text{ (Truncate Value)} \quad (2)$$

The encoder 500 then subtracts the value of the truncated square rooted number, X, from the original time delay number, T, to provide an error value, as illustrated in the following equation 3:

$$Y = T - X^2 \text{ (Square root Error Value)} \quad (3)$$

In summary, the encoder 500 calculates the truncated, square rooted, X, of the input time delay number, as well as the error correction number, Y. The encoder 500 then transmits both numbers X and Y as an 8-bit data stream to the fuze controller 510.

The algorithm used by the encoder 500 to encode the input 16-bit data stream into a two-part 8-bit data stream, ensures fast and reliable data transfer and timing accuracy that is preserved across two different architectures. This helps to limit the redesign of the fuze circuitry while enhancing its capability, by placing the design burden on a module or system outside of the fuze controller 510.

The following examples illustrate the process 600 with more specific details:

Example 1 the 16 bits number to be transmitted is:
T=13739=Hex 35 AB.
The breakdown or encoding of T into two 8-bits numbers X and Y is as follows:
 a) Find X:
  1. Take the square root of T: $\sqrt{(T)} = \sqrt{(13739)} = 117.2134$
  2. Truncate (or round) the above square rooted number to obtain an integer, X:
   X=Floor [$\sqrt{(T)}$]=Floor [117.2134]=117
 b) Find Y:
  3. Square X: $X^2 = (\text{Floor } [\sqrt{(T)}])^2 = (117)^2 = 13689$
  4. Find Y: $Y = T - X^2 = 13739 - 13689 = 50$
 c) Transmit the two 8-bit numbers X and Y (optionally along with a checksum):
   X=117=(Hex 75)
   Y=50=(Hex 32)
   CHECK: $T = X^2 + Y = (117)^2 + 50 = 13739$ Example 2

The velocity correction sensor (or module) measures T=8,275 msec, then:
 X=Floor ($\sqrt{T}$)=Floor ($\sqrt{8,275}$)=90.
 $Y = T - X^2 = 8,275 - (90)^2 = 175$.

Figure 7:
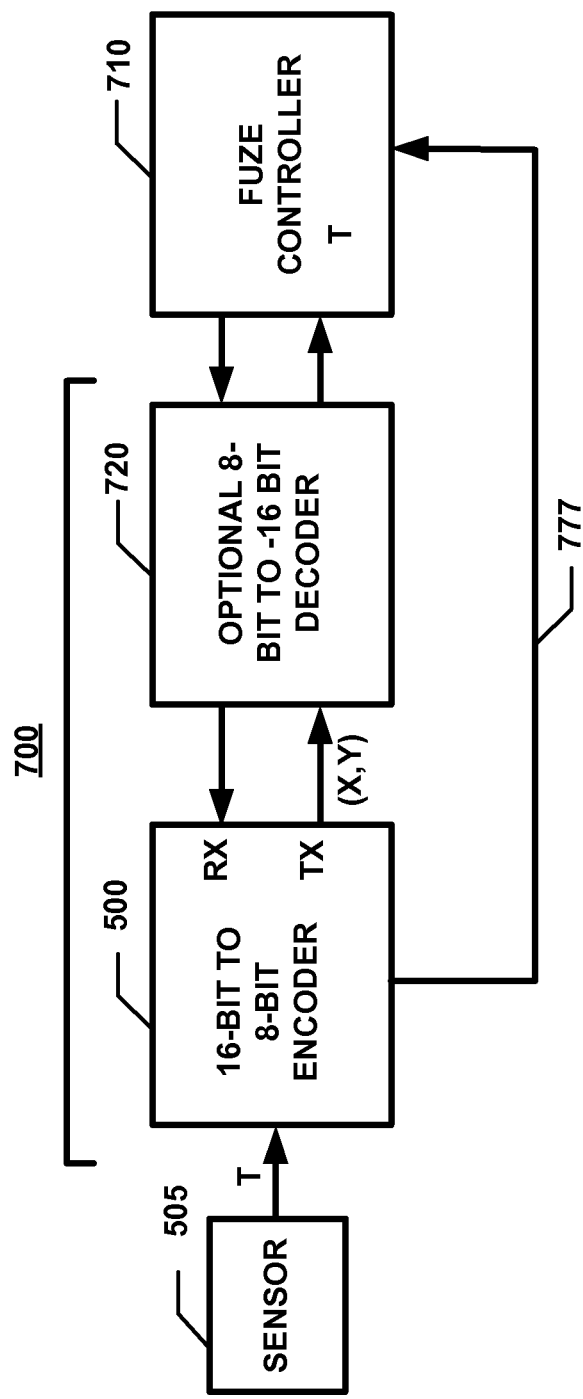
FIG. 7 is a high level block diagram of the components of the computer program product according to an alternative embodiment of the present invention.

Example 3 the 16 bits number to be transmitted is:
T=8275=Hex 20 53.
 a) Find X:
  1. Take the Square Root: $\sqrt{(T)} = \sqrt{(8275)} = 90.9670$
  2. Truncate (or round) the above square rooted number to obtain an integer, X:
   X=Floor [$\sqrt{(T)}$]=Floor [90.9670]=90
 b) Find Y:
  3. Square X: $X^2 = (\text{Floor } [\sqrt{(T)}])^2 = (90)^2 = 8100$
  4. $Y = T - X^2 = 8275 - 8100 = 175$
 c) Transmit the two 8-bit numbers X and Y (optionally along with a checksum):
   X=90=(Hex 5A)
   Y=175=(Hex AF)
   CHECK: $T = X^2 + Y = (90)^2 + 175 = 8275$ FIG. 7 illustrates an alternative computer program product 700 of the present invention, using the same numeral references as the computer program product 100 of FIG. 5, in order to clarify that the computer program product 700 may use the same or similar components as the computer program product 100. The computer program product 700 is embedded within, or programmed onto a 16-bit to 8-bit encoder (or encoding module) 500 that receives an input 16-bit data stream from one or more sensors 505, for transmission to a fuze controller 710.

In this embodiment, the fuze controller 710 may either be an 8-bit platform or a 16-bit platform. If the fuze controller 710 were a 16-bit platform, the computer program product 700 will be provided with an 8-bit to a 16-bit decoder (or decoding module) 720, which reconstructs the original input 16-bit data stream [X, Y], with minimal errors.

Alternatively, the 16-bit fuze controller 710 instructs the encoder 500 to bypass the decoder 720 entirely and to directly transmit the 16-bit data stream to the fuze controller 710, as shown by the arrow 777.

If, on the other hand, the fuze controller 710 were an 8-bit platform, then the encoder 500 transmits the two 8-bit data stream to the fuze controller 710, as described earlier, as shown by the arrow 777.

Figure 8:
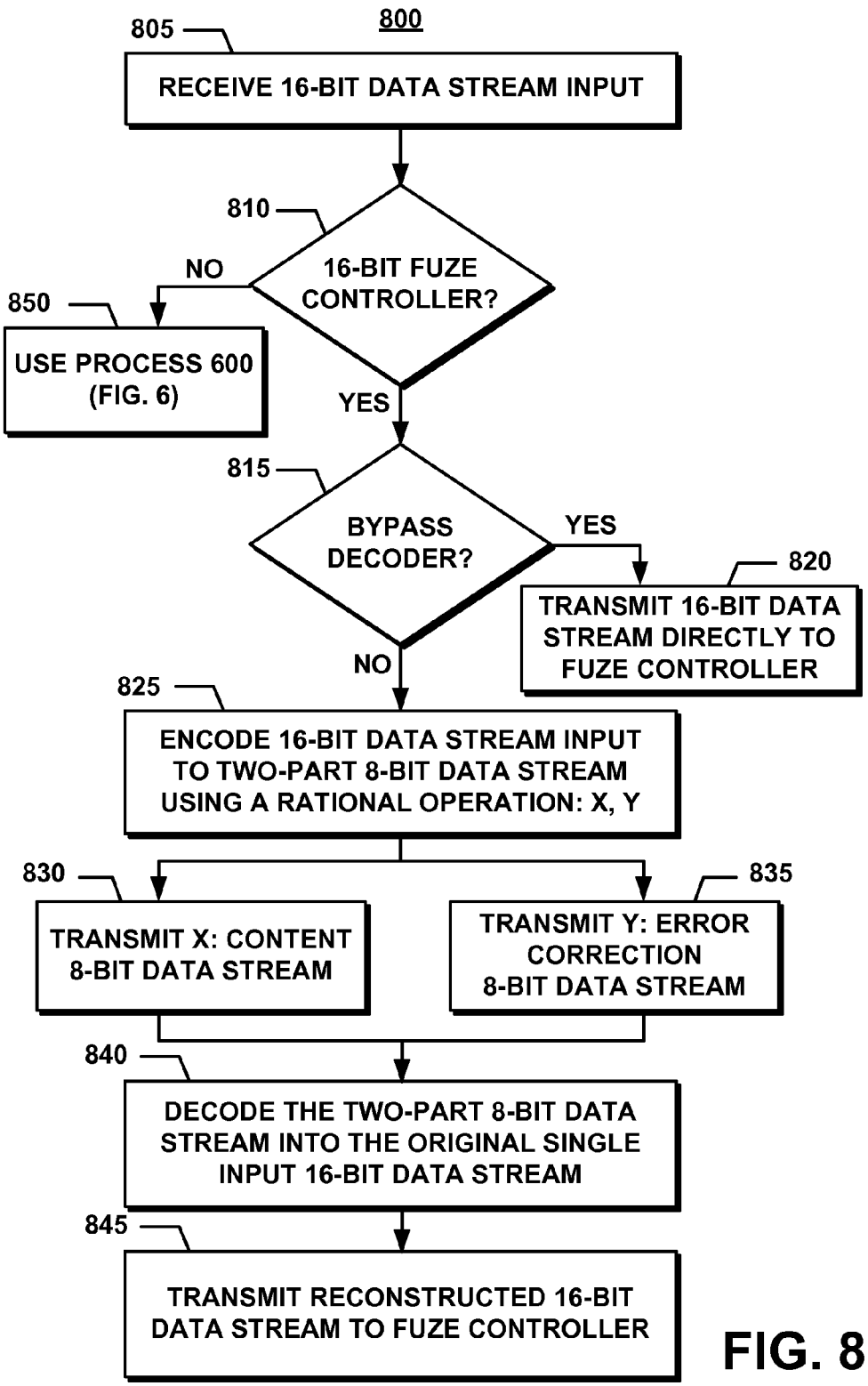
FIG. 8 is a flow chart illustrating the operation of the computer program product of FIG. 7.

FIG. 8 is a flow chart that illustrates a process of operation 800 of the computer program product 700 of FIG. 7. More specifically, the velocity correction module 505 can, for example, compute numbers up to 65,536 (16 bits). The velocity correction module 505 senses or computes the 16-bit time delay number, T, and transfers it to the computer program product 700. As shown at step 805 of the process 800, the encoder module 500 receives the 16-bit time delay number, T, from the sensor module 505.

At step 810, the process 800 determines whether the fuze controller 710 is an 8-bit or a 16-bit platform. If it is determined that the fuze controller 710 is a 16-bit platform, then process 800 makes another determination, at step 815 as to whether it is desired to bypass the decoder 720. If so, then the encoder 500 does not encode the 16-bit input data stream, but rather transmits it directly to the fuze controller 710, along the arrow 777, at step 820.

If however, it is optionally desired to decode the 16-bit input data stream, then, as explained earlier, the encoder module 500 divides, at step 825, the time delay number, T, into a two-part 8-bit data stream that includes an integer (whole number), X, and an error value, Y.

At steps 830, 835, the encoder module 500 transmits the two values X and Y to an optional 8-bit to 16-bit decoder 720. At step 840, the decoder 720 decodes the two-part 8-bit data stream and reconstructs the original single input 16-bit data stream, using, for example, the following equation:

$$\text{Time Delay } (T) = X^2 + Y.$$

At step 845, the decoder 720 transmits the reconstructed 16-bit data stream, T, to the fuze controller 710.

If at decision step 810 it is determined that the fuze controller 710 is an 8-bit platform, then process 800 uses process 600, as described earlier in connection with FIG. 6.

The embodiments described herein are included for the purposes of illustration, and are not intended to be the exclusive; rather, they can be modified within the scope of the invention. For example, while the present invention has been described in terms of 8-bit and 16-bit data streams, it should be understood that the concepts of the present invention are not limited to these values. As an illustration only, 16-bit and 32-bit data streams could be used. In addition, while the present invention has been described in terms of a fuzing system for military applications, it should be abundantly clear that the present invention may be implemented in other applications, whether military or commercial.

What is claimed is:

1. A method for transferring a 16-bit exit velocity, T, of a projectile from a gun barrel, to an 8-bit fuze controller within the projectile, in order to adjust the detonation delay of the fuze, the method comprising:
   a. a sensor module that measures the exit velocity, T, of the projectile from the gun barrel and sends a 16-bit data stream of that measurement to an encoder;
   b. which encoder divides the 16-bit data stream of the exit velocity into two 8-bit data streams (X,Y);
   c. the first part, X, of the two 8-bit data streams is calculated by the encoder to be equal to $T^{1/2}$ truncated to an 8-bit integer;
   d. the second part, Y, of the two 8-bit data streams is calculated by the encoder to be an 8-bit square root error value equal to T minus the calculated 8-bit integer squared;
   e. both 8-bit data streams (X,Y) are input to a fuze controller, which then calculates the exit velocity T as the integer, X, squared, plus the 8-bit square root error value;
   f. the fuze controller then calculates the detonation delay of the projectile.

* * * * *